United States Patent
Li

(10) Patent No.: US 10,461,121 B2
(45) Date of Patent: Oct. 29, 2019

(54) MINIATURE LED DISPLAY PANEL AND MINIATURE LED DISPLAY

(71) Applicant: SHENZHEN CHINA STAR OPTOELECTRONICS TECHNOLOGY CO., LTD., Shenzhen, Guangdong (CN)

(72) Inventor: Wei Li, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/737,285

(22) PCT Filed: Nov. 16, 2017

(86) PCT No.: PCT/CN2017/111253
§ 371 (c)(1),
(2) Date: Dec. 17, 2017

(87) PCT Pub. No.: WO2019/075813
PCT Pub. Date: Apr. 25, 2019

(65) Prior Publication Data
US 2019/0115389 A1    Apr. 18, 2019

(51) Int. Cl.
*H01L 27/15* (2006.01)
*H01L 33/62* (2010.01)
(Continued)

(52) U.S. Cl.
CPC ........ *H01L 27/156* (2013.01); *H01L 25/0753* (2013.01); *H01L 27/124* (2013.01); *H01L 27/1255* (2013.01); *H01L 33/62* (2013.01)

(58) Field of Classification Search
CPC ... H01L 25/167; H01L 31/143; H01L 31/162; H01L 27/3248; H01L 27/326; H01L 27/3262; H01L 27/3276; H01L 27/3288; H01L 27/3297; H01L 2924/12041; H01L 27/156; H01L 27/124; H01L 33/62
See application file for complete search history.

(56) References Cited

U.S. PATENT DOCUMENTS

2004/0041753 A1* 3/2004 Nakanishi ............ G09G 3/3233
345/76
2016/0087108 A1 3/2016 Kwon et al.
(Continued)

FOREIGN PATENT DOCUMENTS

| CN | 104681568 A | 6/2015 |
|---|---|---|
| CN | 106652809 A | 5/2017 |
| CN | 106652820 A | 5/2017 |

*Primary Examiner* — Thanh Y. Tran
(74) *Attorney, Agent, or Firm* — Soroker Agmon Nordman

(57) ABSTRACT

A miniature LED display panel and a miniature LED display are provided. The miniature LED display panel includes a first substrate, a second substrate having a cathode driving circuit disposed on a surface thereof facing the first substrate, N row signal lines disposed on the first substrate, an insulating layer disposed on the first substrate and the row signal lines, M column signal lines disposed on the insulating layer, M compensation signal lines disposed on the insulating layer, and a plurality of LED light emitting components arranged in an array of M rows and N columns on the first substrate.

17 Claims, 2 Drawing Sheets

(51) Int. Cl.
*H01L 27/12* (2006.01)
*H01L 25/075* (2006.01)

(56) References Cited

U.S. PATENT DOCUMENTS

| | | |
|---|---|---|
| 2017/0125392 A1 | 5/2017 | Bibl et al. |
| 2018/0090695 A1* | 3/2018 | Maruyama .......... H01L 27/3248 |
| 2019/0012960 A1 | 1/2019 | Yamazaki et al. |

* cited by examiner

MINIATURE LED DISPLAY PANEL AND MINIATURE LED DISPLAY

FIELD OF INVENTION

The present invention relates to the field of light-emitting diode (LED) displays, and in particular to a miniature LED display panel and a miniature LED display.

BACKGROUND OF DISCLOSURE

MicroLED technology is known as LED miniaturization and matrix technology. In a microLED display, an LED display driver circuit is formed by a normal complementary metal-oxide-semiconductor (CMOS) integrated circuit manufacturing process, and then an LED array is formed on the integrated circuit by a metal-organic chemical vapor deposition (MOCVD) machine.

However, the prior art has no display panel based on LED miniaturization technology, and wiring and structure of a display panel based on LED miniaturization technology are both still unknown.

Therefore, the prior art has defects and urgently needs to be improved.

SUMMARY OF INVENTION

An object of the present disclosure is to provide a miniature LED display panel and a miniature LED display.

To solve the above problem, the technical solution provided by the present disclosure is as follows:

A miniature LED display panel is provided and includes:
a first substrate;
a second substrate having a cathode driving circuit disposed on a surface of the second substrate facing the first substrate;
N row signal lines disposed on the first substrate;
an insulating layer disposed on the first substrate and the row signal lines;
M column signal lines disposed on the insulating layer;
M compensation signal lines disposed on the insulating layer; and
a plurality of LED light emitting components arranged in an array of M rows and N columns on the first substrate;
wherein the LED light emitting components in a same row are electrically connected with a same row signal line, the LED light emitting components in a same column are electrically connected with a same compensation signal line and a same column signal line, and one end of each of the LED light emitting components away from the first substrate is connected with the second substrate and electrically connected with the cathode driving circuit; and
wherein each of the LED light emitting components comprises:
a first thin film transistor disposed on the first substrate and having a source electrically connected with a corresponding column signal line and a gate electrically connected with a corresponding row signal line;
a second thin film transistor disposed on the first substrate and having a source connected with a corresponding compensation signal line and a gate electrically connected with a drain of the first thin film transistor;
a first connecting metal layer disposed on the first substrate and electrically connected with a corresponding row signal line;
a second connecting metal layer disposed on the insulating layer, wherein the first connecting metal layer and the second connecting metal layer partially face each other to form a storage capacitor; and
a light emitting unit having one end electrically connected with the cathode driving circuit and the other end electrically connected with the second connecting metal layer and a drain of the second thin film transistor;
wherein the insulating layer is a silicon nitride layer or a silicon dioxide layer;
wherein each of the first substrate and the second substrate is a glass substrate; and
wherein the light emitting unit is an inorganic LED.

In the miniature LED display panel in the disclosure, the light emitting unit is formed on the first substrate by using a screen printing process, a spraying process, or a silver paste dot printing process.

In the miniature LED display panel in the disclosure, the row signal lines, the column signal lines, and the compensation signal lines are all formed by photolithography.

A miniature LED display panel is also provided and includes:
a first substrate;
a second substrate having a cathode driving circuit disposed on a surface of the second substrate facing the first substrate;
N row signal lines disposed on the first substrate;
an insulating layer disposed on the first substrate and the row signal lines;
M column signal lines disposed on the insulating layer;
M compensation signal lines disposed on the insulating layer; and
a plurality of LED light emitting components arranged in an array of M rows and N columns on the first substrate;
wherein the LED light emitting components in a same row are electrically connected with a same row signal line, the LED light emitting components in a same column are electrically connected with a same compensation signal line and a same the column signal line, and one end of each of the LED light emitting components away from the first substrate is connected with the second substrate and electrically connected with the cathode driving circuit.

In the miniature LED display panel in the disclosure, each of the LED light emitting components comprises:
a first thin film transistor disposed on the first substrate and having a source electrically connected with a corresponding column signal line and a gate electrically connected with a corresponding row signal line;
a second thin film transistor disposed on the first substrate and having a source connected with a corresponding compensation signal line and a gate electrically connected with a drain of the first thin film transistor;
a first connecting metal layer disposed on the first substrate and electrically connected with a corresponding row signal line;
a second connecting metal layer disposed on the insulating layer, wherein the first connecting metal layer and the second connecting metal layer partially face each other to form a storage capacitor; and
a light emitting unit having one end electrically connected with the cathode driving circuit and the other end electrically connected with the second connecting metal layer and a drain of the second thin film transistor.

In the miniature LED display panel in the disclosure, the insulating layer is a silicon nitride layer or a silicon dioxide layer.

In the miniature LED display panel in the disclosure, each of the first substrate and the second substrate is a glass substrate.

In the miniature LED display panel in the disclosure, the light emitting unit is an inorganic LED.

In the miniature LED display panel in the disclosure, the light emitting unit is disposed on the first substrate by using a screen printing process.

In the miniature LED display panel in the disclosure, the light emitting unit is disposed on the first substrate by using a spraying process.

In the miniature LED display panel in the disclosure, the light emitting unit is disposed on the first substrate by using a silver paste dot printing process.

In the miniature LED display panel in the disclosure, the row signal lines, the column signal lines, and the compensation signal lines are all formed by photolithography.

A miniature LED display is provided and includes a miniature LED display panel, and the miniature LED display panel includes:

a first substrate;

a second substrate having a cathode driving circuit disposed on a surface of the second substrate facing the first substrate;

N row signal lines disposed on the first substrate;

an insulating layer disposed on the first substrate and the row signal lines;

M column signal lines disposed on the insulating layer;

M compensation signal lines disposed on the insulating layer; and a plurality of LED light emitting components arranged in an array of M rows and N columns on the first substrate;

wherein the LED light emitting components in a same row are electrically connected with a same row signal line, the LED light emitting components in a same column are electrically connected with a same compensation signal line and a same column signal line, and one end of each of the LED light emitting components away from the first substrate is connected with the second substrate and electrically connected with the cathode driving circuit.

In the miniature LED display in the disclosure, each of the LED light emitting components comprises:

a first thin film transistor disposed on the first substrate and having a source electrically connected with a corresponding column signal line and a gate electrically connected with a corresponding row signal line;

a second thin film transistor disposed on the first substrate and having a source connected with a corresponding compensation signal line and a gate electrically connected with a drain of the first thin film transistor;

a first connecting metal layer disposed on the first substrate and electrically connected with a corresponding row signal line;

a second connecting metal layer disposed on the insulating layer, wherein the first connecting metal layer and the second connecting metal layer partially face each other to form a storage capacitor; and a light emitting unit having one end electrically connected with the cathode driving circuit and the other end electrically connected with the second connecting metal layer and a drain of the second thin film transistor.

In the miniature LED display in the disclosure, the insulating layer is a silicon nitride layer or a silicon dioxide layer.

In the miniature LED display in the disclosure, each of the first substrate and the second substrate is a glass substrate.

In the miniature LED display in the disclosure, the light emitting unit is an inorganic LED.

In the miniature LED display in the disclosure, the light emitting unit is disposed on the first substrate by using a screen printing process, a spraying process, or a silver paste dot printing process.

In the miniature LED display in the disclosure, the row signal lines, the column signal lines, and the compensation signal lines are all formed by photolithography.

Compared with the prior art, the functions of the miniature LED display panel and the miniature LED display are achieved in the present disclosure by disposing the cathode driving circuit on the first substrate and disposing the row signal lines, the column signal lines, and the compensation signals on the second substrate. The light emitting switch control and the luminous flux control of the light emitting components are achieved by the row signal lines, the column signal lines, and the compensation signal lines.

DETAILED DESCRIPTION OF PREFERRED EMBODIMENTS

Figure 1:
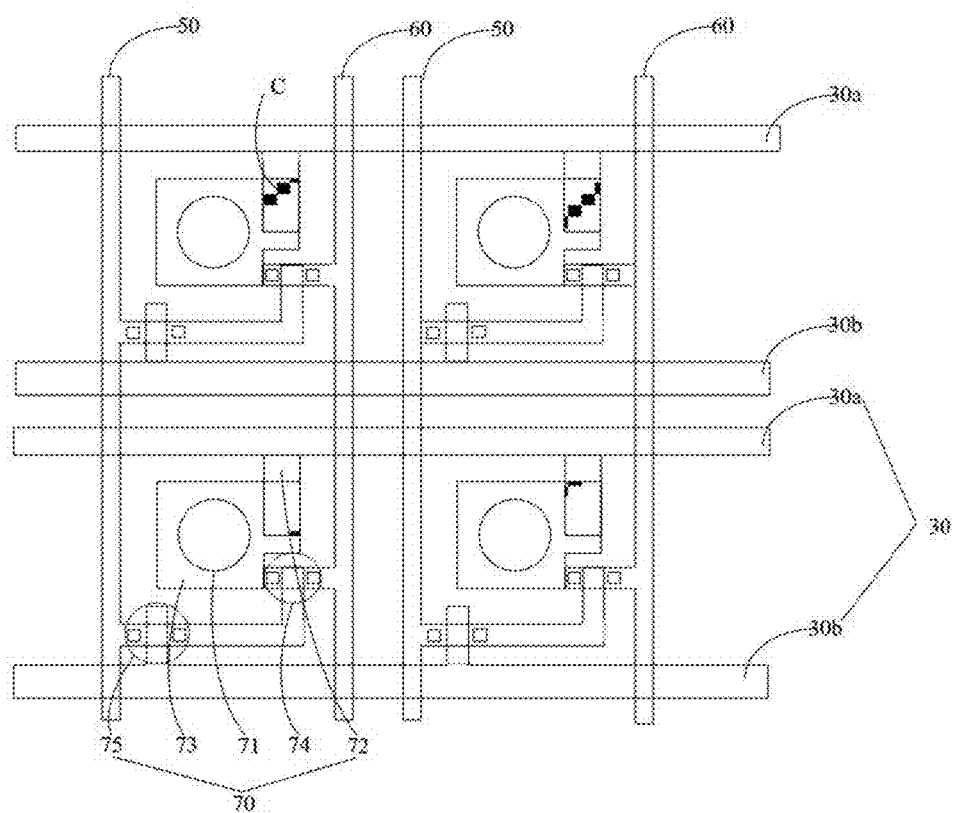
FIG. 1 is a planar structural schematic diagram of a miniature LED display panel in the present disclosure.

The following description of the embodiments with reference to the accompanying drawings is used to illustrate particular embodiments of the present disclosure. The directional terms referred to in the present disclosure, such as "upper", "lower", "front", "back", "left", "right", "inner", "outer", "side surface", etc., are only directions with regard to the accompanying drawings. Therefore, the directional terms used for describing and illustrating the present disclosure are not intended to limit the present disclosure.

In the drawings, modules with similar structures are indicated by same reference number.

Figure 2:
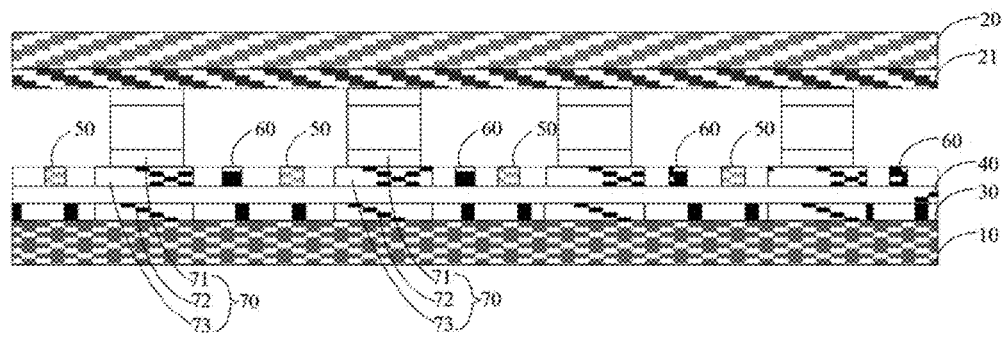
FIG. 2 is a cross-sectional structural schematic diagram of the miniature LED display panel in the present disclosure.
Figure 3:
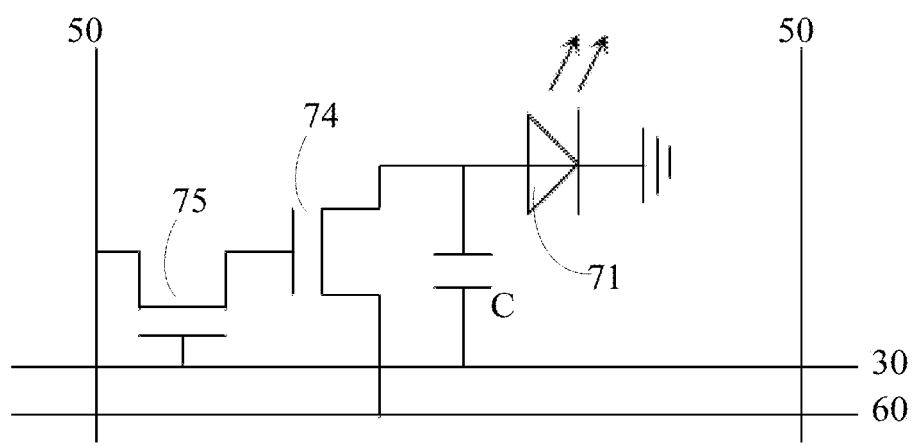
FIG. 3 is a partial circuit diagram of the miniature LED display panel in the present disclosure.

Refer to FIGS. 1, 2, and 3. The miniature LED display panel includes a first substrate 10, a second substrate 20, N row signal lines 30, an insulating layer 40, M column signal lines 50, M compensation signal lines 60, and a plurality of LED light emitting components 70. The plurality of LED light emitting components 70 are arranged in an array.

The first substrate 10 is a glass substrate.

The second substrate 20 is a glass substrate. A cathode driving circuit 21 is disposed on a surface of the second substrate 20 facing the first substrate 10. The cathode driving circuit 21 may be formed on the second substrate 20 by photolithography.

The N row signal lines 30 are all disposed on the first substrate 10. Each of the row signal lines 30 is configured to provide a first electrical signal to the corresponding LED light emitting component 70.

The insulating layer 40 is disposed on the first substrate 10 and the row signal control lines 30. The insulating layer 40 may be a silicon nitride layer or a silicon dioxide layer, and is formed by chemical vapor deposition.

The M column signal lines 50 are disposed on the insulating layer 40. Each of the column signal lines 60 is configured to provide a second electrical signal to the corresponding LED light emitting component 70.

The M compensation signal lines 60 are disposed on the insulation layer 40. Each of the compensation signal lines 60 is configured to provide a compensation signal to the corresponding LED light emitting component 70.

The plurality of LED light emitting components 70 are arranged in an array of M rows and N columns on the first substrate 10. One end of each of the LED light emitting components 70 away from the first substrate 10 is connected with the second substrate 20 and electrically connected with the cathode driving circuit 21. Each of the LED light emitting units 70 is electrically connected with the corresponding row signal line 30, the corresponding compensation signal line 60, and the corresponding column signal line 50.

In actual manufacture, the row signal lines, the column signal lines, and the compensation signal lines are formed using photolithography. Each of the row signal lines 30 includes a first sub-row signal line 30a and a second sub-row signal line 30b.

Each of the LED light emitting components 70 includes a light emitting unit 71, a first connecting metal layer 72, a second connecting metal layer 73, a fast thin film transistor 75, and a second thin film transistor 74.

The light emitting unit 71 is an inorganic LED. The light emitting unit 71 may be formed on the first substrate 10 by a spraying process. Alternatively, the light emitting unit 71 may be formed on the first substrate 10 by a silver paste dot printing process. Alternatively, the light emitting unit 71 may be formed on the first substrate 10 by a screen printing process.

The first thin film transistor 75 is disposed on the first substrate 10, and has a source electrically connected with a corresponding column signal line 50, a gate electrically connected with the corresponding second sub-row signal line 30b of the row signal lines 30, and a drain electrically connected with a gate of the second thin film transistor 74. The second thin film transistor 74 is disposed on the first substrate 10, and has a source electrically connected with a corresponding compensation signal line 60.

The first connecting metal layer 72 is disposed on the first substrate 10 and located on the same layer as the row signal lines 30. The first connecting metal layer 72 is electrically connected with the first sub-row signal line 30a of the row signal lines 30. Firstly, a metal layer is formed on the first substrate 10, and then the metal layer is patterned to respectively form the plurality of row signal lines 30 and the first connecting metal layer 72.

The second connecting metal layer 73 is disposed on the first substrate 10. Specifically, the second connecting metal layer 73 is disposed on the insulating layer 40. The first connecting metal layer 72 and the second connecting metal layer 73 partially face each other to form a storage capacitor C. The second connecting metal layer 73 is located on the same layer as the column signal lines 50 and the compensation signal lines 60. The anode of the light emitting unit 71 is connected with the second connecting metal layer 73 and a drain of the second thin film transistor 74. The cathode of the light emitting unit 71 is electrically connected with the cathode driving circuit 21 on the second substrate 20.

In actual manufacture, firstly, a metal layer is formed on the insulating layer 40, and then the metal layer is patterned to respectively form the second connecting layer 73, the column signal lines 50, and the compensation signal lines 60.

In operation, the column signal lines provide the second electrical signal to the sources of the first thin film transistors, the row signal lines provide the first electrical signal to the storage capacitors C1 and the gates of the first thin film transistors, and the compensation signal lines provide a compensation voltage signal to the sources of the second thin film transistors. The first electrical signal supplies power to the anodes of the light emitting units through the storage capacitors C1, so as to drive the light emitting units to emit light. The first electrical signal turns on the first thin film transistors, so that the second electrical signal is transmitted to the gates of the second thin film transistors, thereby turning on the second thin film transistors. The second thin film transistors are turned on, so that the compensation voltage signal is transmitted to the anodes of the light emitting units to increase the compensation current provided to the light emitting units, thereby adjusting the light emitting brightness thereof.

An embodiment of the present disclosure further provides a miniature. LED display, including the miniature LED display panel in the above embodiments.

Compared with the prior art, the functions of the miniature LED display panel and the miniature LED display are achieved in the present disclosure by disposing the cathode driving circuit on the first substrate and disposing the row signal lines, the column signal lines, and the compensation signals on the second substrate. The light emitting switch control and the luminous flux control of the light emitting components are achieved by the row signal lines, the column signal lines, and the compensation signal lines.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A miniature LED display panel comprising:
   a first substrate;
   a second substrate having a cathode driving circuit disposed on a surface of the second substrate facing the first substrate;
   N row signal lines disposed on the first substrate;
   an insulating layer disposed on the first substrate and the row signal lines;
   M column signal lines disposed on the insulating layer;
   M compensation signal lines disposed on the insulating layer; and
   a plurality of LED light emitting components arranged in an array of M rows and N columns on the first substrate;
   wherein the LED light emitting components in a same row are electrically connected with a same row signal line, the LED light emitting components in a same column are electrically connected with a same compensation signal line and a same column signal line, and one end of each of the LED light emitting components away from the first substrate is connected with the second substrate and electrically connected with the cathode driving circuit; and
   wherein each of the LED light emitting components comprises:
   a first thin film transistor disposed on the first substrate and having a source electrically connected with a corresponding column signal line and a gate electrically connected with a corresponding row signal line;
   a second thin film transistor disposed on the first substrate and having a source connected with a corresponding compensation signal line and a gate electrically connected with a drain of the first thin film transistor;

a first connecting metal layer disposed on the first substrate and electrically connected with a corresponding row signal line;

a second connecting metal layer disposed on the insulating layer, wherein the first connecting metal layer and the second connecting metal layer partially face each other to form a storage capacitor; and a light emitting unit having one end electrically connected with the cathode driving circuit and the other end electrically connected with the second connecting metal layer and a drain of the second thin film transistor;

wherein the insulating layer is a silicon nitride layer or a silicon dioxide layer;

wherein each of the first substrate and the second substrate is a glass substrate; and wherein the light emitting unit is an inorganic LED.

2. The miniature LED display panel as claimed in claim 1, wherein the light emitting unit is formed on the first substrate by using a screen printing process, a spraying process, or a silver paste dot printing process.

3. The miniature LED display panel as claimed in claim 1, wherein the row signal lines, the column signal lines, and the compensation signal lines are all formed by photolithography.

4. A miniature LED display panel comprising:

a first substrate;

a second substrate having a cathode driving circuit disposed on a surface of the second substrate facing the first substrate;

N row signal lines disposed on the first substrate;

an insulating layer disposed on the first substrate and the row signal lines;

M column signal lines disposed on the insulating layer;

M compensation signal lines disposed on the insulating layer; and a plurality of LED light emitting components arranged in an array of M rows and N columns on the first substrate;

wherein the LED light emitting components in a same row are electrically connected with a same row signal line, the LED light emitting components in a same column are electrically connected with a same compensation signal line and a same column signal line, and one end of each of the LED light emitting components away from the first substrate is connected with the second substrate and electrically connected with the cathode driving circuit, wherein each of the LED light emitting components comprises:

a first thin film transistor disposed on the first substrate and having a source electrically connected with a corresponding column signal line and a gate electrically connected with a corresponding row signal line;

a second thin film transistor disposed on the first substrate and having a source connected with a corresponding compensation signal line and a gate electrically connected with a drain of the first thin film transistor;

a first connecting metal layer disposed on the first substrate and electrically connected with a corresponding row signal line;

a second connecting metal layer disposed on the insulating layer, wherein the first connecting metal layer and the second connecting metal layer partially face each other to form a storage capacitor; and a light emitting unit having one end electrically connected with the cathode driving circuit and the other end electrically connected with the second connecting metal layer and a drain of the second thin film transistor.

5. The miniature LED display panel as claimed in claim 4, wherein the insulating layer is a silicon nitride layer or a silicon dioxide layer.

6. The miniature LED display panel as claimed in claim 4, wherein each of the first substrate and the second substrate is a glass substrate.

7. The miniature LED display panel as claimed in claim 4, wherein the light emitting unit is an inorganic LED.

8. The miniature LED display panel as claimed in claim 4, wherein the light emitting unit is disposed on the first substrate by using a screen printing process.

9. The miniature LED display panel as claimed in claim 4, wherein the light emitting unit is disposed on the first substrate by using a spraying process.

10. The miniature LED display panel as claimed in claim 4, wherein the light emitting unit is disposed on the first substrate by using a silver paste dot printing process.

11. The miniature LED display panel as claimed in claim 4, wherein the row signal lines, the column signal lines, and the compensation signal lines are all formed by photolithography.

12. A miniature LED display, comprising a miniature LED display panel, the miniature LED display panel comprising:

a first substrate;

a second substrate having a cathode driving circuit disposed on a surface of the second substrate facing the first substrate;

N row signal lines disposed on the first substrate;

an insulating layer disposed on the first substrate and the row signal lines;

M column signal lines disposed on the insulating layer;

M compensation signal lines disposed on the insulating layer; and a plurality of LED light emitting components arranged in an array of M rows and N columns on the first substrate;

wherein the LED light emitting components in a same row are electrically connected with a same row signal line, the LED light emitting components in a same column are electrically connected with a same compensation signal line and a same column signal line, and one end of each of the LED light emitting components away from the first substrate is connected with the second substrate and electrically connected with the cathode driving circuit, wherein each of the LED light emitting components comprises:

a first thin film transistor disposed on the first substrate and having a source electrically connected with a corresponding column signal line and a gate electrically connected with a corresponding row signal line;

a second thin film transistor disposed on the first substrate and having a source connected with a corresponding compensation signal line and a gate electrically connected with a drain of the first thin film transistor;

a first connecting metal layer disposed on the first substrate and electrically connected with a corresponding row signal line;

a second connecting metal layer disposed on the insulating layer, wherein the first connecting metal layer and the second connecting metal layer partially face each other to form a storage capacitor; and a light emitting unit having one end electrically connected with the cathode driving circuit and the other end electrically connected with the second connecting metal layer and a drain of the second thin film transistor.

13. The miniature LED display as claimed in claim 12, wherein the insulating layer is a silicon nitride layer or a silicon dioxide layer.

14. The miniature LED display as claimed in claim 12, wherein each of the first substrate and the second substrate is a glass substrate.

15. The miniature LED display as claimed in claim 12, wherein the light emitting unit is an inorganic LED.

16. The miniature LED display as claimed in claim 12, wherein the light emitting unit is disposed on the first substrate by using a screen printing process, a spraying process, or a silver paste dot printing process.

17. The miniature LED display as claimed in claim 12, wherein the row signal lines, the column signal lines and the compensation signal lines are all formed by photolithography.

\* \* \* \* \*

UNITED STATES PATENT AND TRADEMARK OFFICE
CERTIFICATE OF CORRECTION

PATENT NO. : 10,461,121 B2  
APPLICATION NO. : 15/737285  
DATED : October 29, 2019  
INVENTOR(S) : Wei Li Page 1 of 1

It is certified that error appears in the above-identified patent and that said Letters Patent is hereby corrected as shown below:

On the Title Page

Item (30) Foreign Application Priority Data  
Insert -- Oct 17, 2017 (CN) ................................ 201710961523.6 --

Signed and Sealed this  
Ninth Day of June, 2020

Andrei Iancu  
*Director of the United States Patent and Trademark Office*